United States Patent [19]
Caravella et al.

[11] Patent Number: 5,898,633
[45] Date of Patent: Apr. 27, 1999

[54] CIRCUIT AND METHOD OF LIMITING LEAKAGE CURRENT IN A MEMORY CIRCUIT

[75] Inventors: James S. Caravella, Chandler; David F. Mietus, Phoenix; Jeremy W. Moore, Chandler, all of Ariz.

[73] Assignee: Motorola, Inc., Schaumburg, Ill.

[21] Appl. No.: 08/859,897

[22] Filed: May 21, 1997

[51] Int. Cl.⁶ .................................................. G11C 8/00
[52] U.S. Cl. ................. 365/226; 365/185.18; 365/185.33
[58] Field of Search ................................. 365/226, 185.18, 365/189.81, 185.33; 455/127; 327/310, 321

[56] References Cited

U.S. PATENT DOCUMENTS

| | | | |
|---|---|---|---|
| 4,903,093 | 2/1990 | Ide et al. | 357/23.13 |
| 5,497,023 | 3/1996 | Nakazato et al. | 257/394 |
| 5,557,568 | 9/1996 | Miyamoto et al. | 365/185.22 |
| 5,640,002 | 6/1997 | Ruppert et al. | 235/472 |

*Primary Examiner*—David Nelms
*Assistant Examiner*—Hien Nguyen
*Attorney, Agent, or Firm*—Robert D. Atkins

[57] ABSTRACT

A current limiting circuit (70) controls the leakage current of a memory circuit (24) of a portable wireless device (10) while operating in a standby mode. A first semiconductor well (64) isolates the memory circuit (24) that is disposed in a second semiconductor well (66) from a substrate (62). In the standby mode the current limiting circuit (70) is switched to a non-conduction mode that limits the leakage currents of a diode formed by the first semiconductor well (66) with the second semiconductor well (64) and a diode formed by the second semiconductor well (64) with the substrate (62).

19 Claims, 2 Drawing Sheets

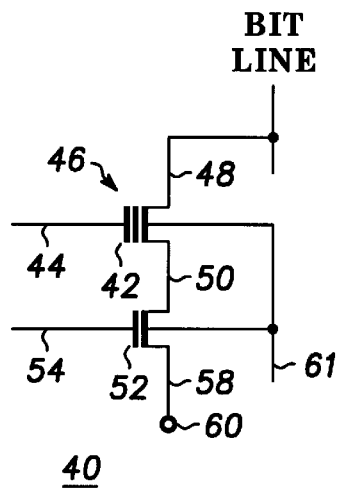
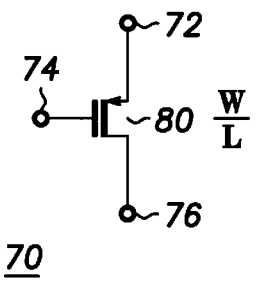
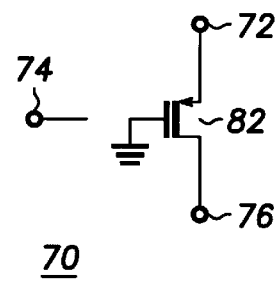
FIG. 3    FIG. 5    FIG. 6
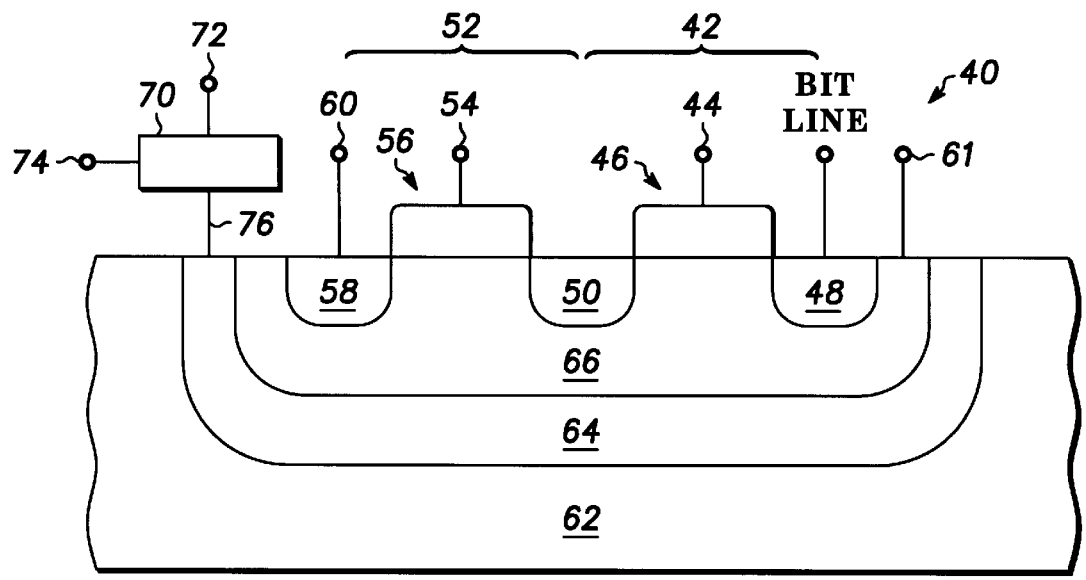
FIG. 4
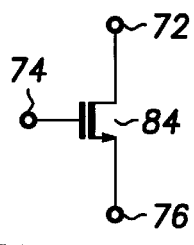
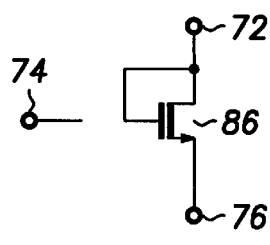
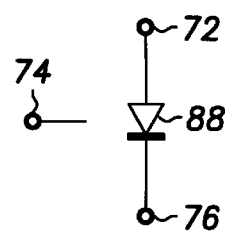
FIG. 7    FIG. 8    FIG. 9

5,898,633

CIRCUIT AND METHOD OF LIMITING LEAKAGE CURRENT IN A MEMORY CIRCUIT

BACKGROUND OF THE INVENTION

The present invention relates, in general, to integrated circuits and, more particularly, to current limiting circuits.

A portable wireless system such as a cellular phone or a pager uses analog and active circuitry to convert signals between frequencies ranging from radio frequency (RF) to base band. Received RF signals are converted to base-band signals through circuits such as an RF transceiver, a down converter, and a demodulator. In the case of a cellular phone, the converted base-band signals are processed into recognizable speech in the voice band frequencies. The portable wireless system typically draws its operating power from a battery source. Analog and active circuitry in the portable wireless system are primary sources of battery current drain during system operation.

The transistors of the analog and active circuitry have well regions formed in a substrate of the integrated circuit. The reverse-biased PN-junction diodes formed by the well regions in the substrate have leakage currents based on the junction area of the diodes. When the portable wireless system is not transmitting or receiving signals the system enters a standby mode to prolong battery life. In standby mode a majority of the analog and active circuitry is disabled which causes the diode leakage currents to be the dominant current that diminishes the life of the battery.

Accordingly, it would be advantageous to have a circuit that limits the diode leakage currents of an integrated circuit during a standby mode to prolong the battery life of a portable wireless system. It would be of further advantage that the current limiting circuit have a small size and be easily integrated.

BRIEF DESCRIPTION OF THE DRAWINGS

FIG. 3 is a schematic diagram of a memory cell of the memory circuit;

FIG. 4 is a cross-sectional view of the memory cell and a current limiting circuit; and FIGS. 5–9 are embodiments of the current limiting circuit.

DETAILED DESCRIPTION OF THE PREFERRED EMBODIMENT

Generally, the present invention provides a circuit and method for current limiting the memory cells of a memory array in a portable wireless system while operating in a standby mode. The portable wireless communication system draws its supply voltage from a local battery source. Analog and active circuitry are primary sources of current drain during normal system operation. However, in the standby mode active circuitry is disabled and the leakage currents from the well regions associated with the transistors of the integrated circuit are the primary source of current drain that diminishes battery life. The portable wireless system typically operates in the standby mode for a high percentage of the time. Thus, the current limiting circuit is switched off during the standby mode to limit the semiconductor well leakage currents and prolong the life of the battery.

Figure 1:
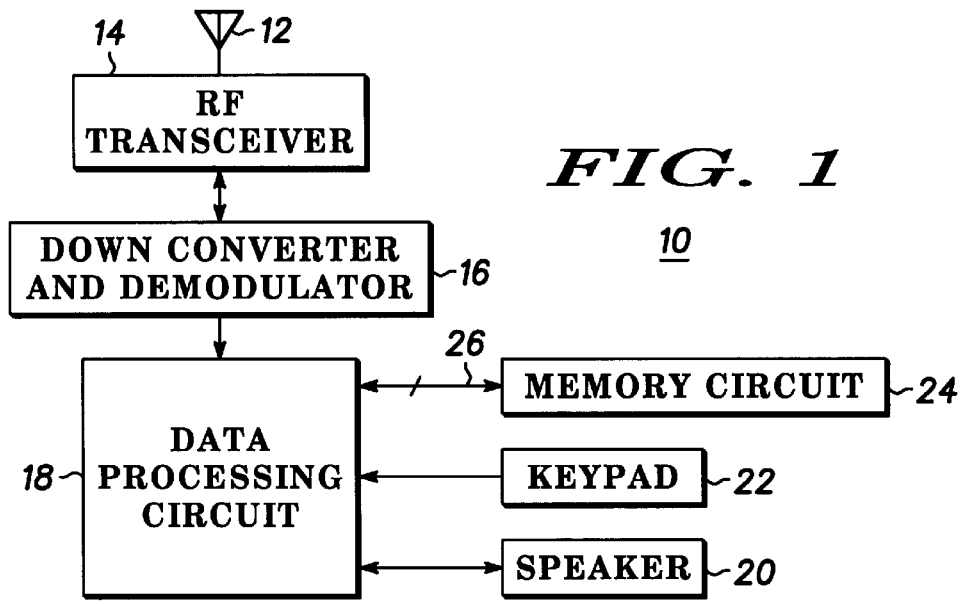
FIG. 1 is a block diagram of a wireless communication device.

FIG. 1 is a block diagram of a wireless communication device 10 such as a cellular telephone or a two-way radio. Wireless communication device 10 includes an antenna 12, an RF transceiver 14 (transmitter circuit and a receiver circuit), a down converter and demodulator circuit 16, a data processing circuit 18, a speaker 20, a keypad 22, and a memory circuit 24. Antenna 12 receives a transmitted radio frequency carrier signal modulated with digital information. RF transceiver 14 amplifies the RF carrier signal and converts the frequency down to an intermediate frequency (IF) signal which is coupled to an input of a down converter and demodulator circuit 16. It should be noted that RF transceiver 14 is also referred to as a translator that is coupled for receiving a transmitted signal. Down converter and demodulator circuit 16 extracts the digital information from the IF signal to produce baseband digital data which is coupled to an input of a data processing circuit 18. Data processing circuit 18 operates under the control of software program instructions that are stored in a nonvolatile FLASH memory in memory circuit 24. Data processing circuit 18 has an input that receives data from keypad 22 and an output that produces audio signals for driving speaker 20.

Figure 2:
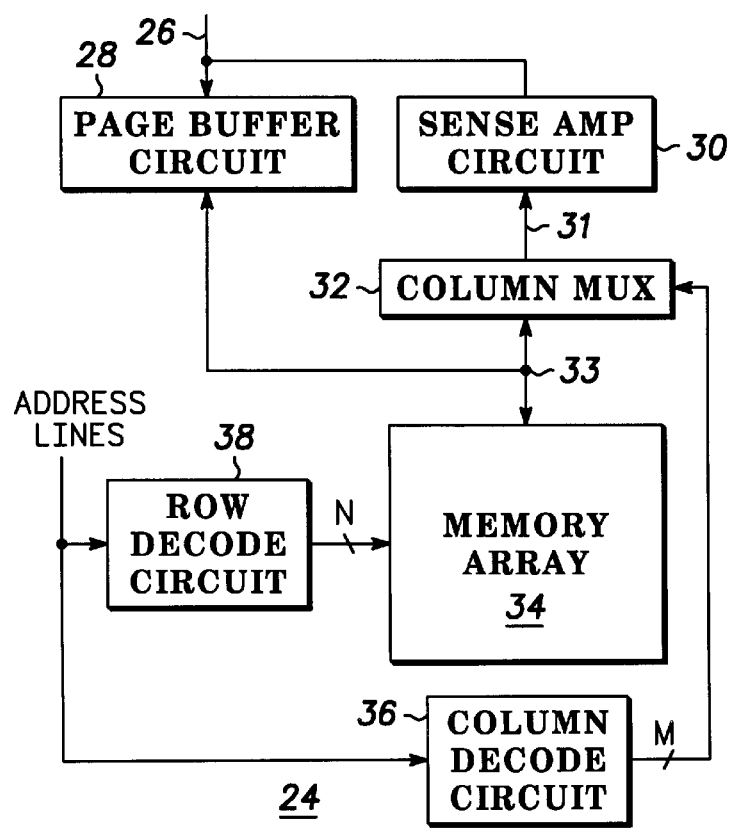
FIG. 2 is a block diagram of a memory circuit in the wireless communication device.

FIG. 2 is a block diagram of memory circuit 24. FLASH memory circuit 24 is initially erased and memory cells that are to be programmed with a logic one data value are written. Page buffer circuit 28 is coupled for receiving input signals via bi-directional bus 26. Page buffer circuit 28 is connected to sense amp circuit 30 via a bus 26. Sense amp circuit 30 has a data bus 31 that connects to a column mux 32. Column mux 32 has control inputs that are coupled for receiving address signals and allows data to be read from selected bit lines in memory array 34. Column decode circuit 36 receives address lines from the address bus and decodes the address lines for selecting a column of memory cells in column mux 32. Row decode circuit 38 receives address lines from the address bus and decodes the address lines for selecting a row of memory cells within memory array 34. It should be noted that the number of lines for bidirectional buses 26, 31, and 33 is not a limitation of the present invention.

FIG. 3 is a block diagram of a memory cell 40. Briefly referring to FIG. 2, multiple instances of memory cell 40 are configured into an array and arranged in rows and columns of memory array 34 (array not shown). Memory cell 40 is a two-transistor memory cell that includes a control transistor 42 and a select transistor 52. control transistor 42 has a gate terminal 44, a gate structure 46, a drain region 48, and a source region 50. Select transistor 52 has a gate terminal 54, a gate structure 56, a drain region 50, and a source region 58. In particular, drain region 48 of control transistor 42 serves as an output of memory cell 40 that either receives or generates a signal, BIT LINE. The source region of control transistor 42 is commonly connected to the drain region of select transistor 52 and is referred to by the reference number 50. Source region 58 of select transistor 52 is connected to a power supply conductor 60. Both drain region 48 and source region 50 of control transistor 42 and both drain region 50 and source region 58 of select transistor 52 are disposed in a well region that is contacted by well terminal 61. Select transistor 52 is shown connected to the source of control transistor 42 and is referred to as a source selected memory architecture. However, the type of memory architecture is not a limitation of the present invention. In other words, the memory cell could be a one-transistor memory cell architecture.

It should be noted that control transistor 42 is shown as a floating gate transistor. In other words, control transistor 42 is a non-volatile memory storage transistor that traps charge on a floating gate, i.e., a gate material that is separate and isolated from the gate terminal. It should be further noted that control transistor 42 and select transistor 52 are shown as N-channel metal oxide semiconductor field effect transistors (MOSFETs). However, the type of transistor is not a limitation of the present invention.

In operation, memory cell 40 stores digital data in a PROGRAM mode, reads stored digital data in a READ mode, and erases stored digital data in an ERASE mode. Gate terminals 44 and 54 of memory cell 40 are referred to as a control terminal and a select gate, respectively. Power supply conductor 60 is referred to as a SOURCE TERMINAL.

The TABLE below lists the voltage values that are applied to the control terminal, the select gate, the SOURCE TERMINAL, and the WELL TERMINAL of memory cell 40 when operating in the READ mode, the PROGRAM mode, and the ERASE mode. In addition, a voltage value is also supplied as the BIT LINE signal in the PROGRAM mode. By way of example, the value stored in memory cell 40 is output as the BIT LINE signal in the READ mode when the select gate voltage transitions from about 0 volts to about VDD, and the control terminal and SOURCE TERMINAL have voltage values of about +1.2 volts and about 0 volts, respectively.

Alternatively, a value is stored in memory cell 40 in the PROGRAM mode when the respective voltage values of about −9 volts and about 0 volts are supplied to the control terminal and to the SOURCE TERMINAL. The voltage value on the gate terminal of select transistor 52 is any voltage within the range of VDD to ground. Memory cell 40 is programmed when the BIT LINE signal has a value of about +5.5 volts and remains unchanged when the BIT LINE signal has a value of about 0 volts. The letter X in the table represents a don't care voltage value.

| MODE | BIT LINE SIGNAL | CONTROL TERMINAL VOLTAGE | SELECT GATE VOLTAGE | SOURCE TERMINAL VOLTAGE | WELL TERMINAL VOLTAGE |
|---|---|---|---|---|---|
| READ | output | +1.2 V | 0 V/VDD | 0 V | 0 V |
| PROGRAM | +5.5 V | −9 V | X | 0 V | 0 V |
| ERASE | floats | +13 V | 0 V | −5 V | −5 V |

The logic value stored in memory cell 40 is cleared in the ERASE mode when the select gate voltage is about zero volts, and the respective voltage values of about +13 volts and about −5 volts are supplied to the control terminal and to the SOURCE TERMINAL.

FIG. 4 is a cross-sectional view of memory cell 40 that is coupled to a current limiting circuit 70, It should be noted that the same reference numbers are used in the figures to denote the same elements. A semiconductor region 64 is an isolation region that is disposed in substrate 62 and separates memory cell 40 from substrate 62. Another semiconductor region 66 includes memory cell 40 and is disposed in semiconductor region 64. Well terminal 61 contacts semiconductor region 66. By way of example, substrate 62 is a P-type semiconductor material, semiconductor region 64 is an isolated N-well region, and semiconductor region 66 is an isolated P-well region. Typically, N-well and P-well regions are formed with lighter impurity concentrations when compared with the impurity concentrations used to form the source and drain regions of a MOSFET.

Memory cell 40 in semiconductor region 66 has gate structures 46 and 56 formed thereon. In accordance with one embodiment of the present invention, gate structures 46 and 56 are connected to respective gate terminals 44 and 54. Memory cell 40 includes control transistor 42 and select transistor 52. Control transistor 42 has gate terminal 44, gate structure 46, drain region 48, and source region 50. Select transistor 52 has gate terminal 54, gate structure 56, drain region 50, and source region 58. Drain region 48 of control transistor 42 is connected to the signal, BIT LINE. The source region of control transistor 42 is commonly connected to the drain region of select transistor 52 and is referred to by the reference number 50. Source region 58 of select transistor 52 is connected to power supply conductor 60.

Current limiting circuit 70 includes a power supply conductor 72, a control terminal 74, and an output terminal 76. Output terminal 76 is connected to semiconductor region 64 by an ohmic connection. Current limiting circuit 70 provides a current conduction path between the power supply conductor 72 and the output terminal 76.

FIG. 5 is a preferred embodiment of current limiting circuit 70. Current limiting circuit 70 is a P-channel MOSFET 80 having a gate terminal, a drain terminal, and a source terminal. Also, it should be noted that a MOSFET can have terminals referred to as a control terminal and current conducting terminals. In particular, the gate terminal of MOSFET 80 serves as control terminal 74 of current limiting circuit 70. The source terminal of MOSFET 80 serves as power supply conductor 72 of current limiting circuit 70. The drain terminal of MOSFET 80 serves as output terminal 76 of current limiting circuit 70.

In operation, when control terminal 74 is supplied with a logic zero value, i.e., a voltage value of about ground, MOSFET 80 as an enhancement transistor is in a conductive mode. In the conductive mode output terminal 76 of MOSFET 80 has a voltage value of about VDD when power supply conductor 72 is supplied with a voltage of VDD. Current limiting circuit 70 operates in the conductive mode to supply the leakage currents of the reverse-biased diodes that are formed by semiconductor region 64 with substrate 62 and semiconductor region 64 with semiconductor region 66.

When control terminal 74 is supplied with a logic one value, i.e., a voltage value of about VDD, MOSFET 80 is in a non-conductive mode of operation. In the non-conductive mode MOSFET 80 is off and operates to block the supply of leakage currents to the reverse-biased diodes that are formed by semiconductor region 64 with substrate 62 and semiconductor region 64 with semiconductor region 66. It should be understood that when MOSFET 80 is non-conductive that another semiconductor device (not shown) can be used to insure that well region 64 is not negatively biased such that the diode formed by region 64 with substrate 62 becomes forward biased.

FIG. 6 is a first alternate embodiment of current limiting circuit 70. Current limiting circuit 70 is a P-channel MOSFET 82 having a gate terminal, a drain terminal, and a source terminal. In particular, the gate terminal of MOSFET 82 is connected to a power supply conductor and receives a voltage such as, for example, ground. The source terminal of MOSFET 82 serves as power supply conductor 72 of current limiting circuit 70. The drain terminal of MOSFET 82 serves as output terminal 76 of current limiting circuit 70. The control terminal 74 of current limiting circuit 70 is not connected.

In operation, MOSFET 82 has an output voltage value at terminal 76 of about VDD when power supply conductor 72 is supplied with a voltage of VDD. MOSFET 82 operates in a conductive mode to supply the leakage currents of the reverse-biased diodes that are formed by semiconductor region 64 with substrate 62 and semiconductor region 64 with semiconductor region 66.

FIG. 7 is a second alternate embodiment of current limiting circuit 70. Current limiting circuit 70 is an N-channel MOSFET 84 having a gate terminal, a drain terminal, and a source terminal. In particular, the gate terminal of MOSFET 84 serves as control terminal 74 of current limiting circuit 70. The source terminal of MOSFET 84 serves as output terminal 76 of current limiting circuit 70. The drain terminal of MOSFET 84 serves as power supply conductor 72 of current limiting circuit 70.

In operation, when control terminal 74 is supplied with a logic one value, i.e., a voltage value of about VDD, MOSFET 84 as an enhancement transistor is in a conductive mode. In the conductive mode output terminal 76 of MOSFET 84 has a voltage value of VDD minus a threshold voltage value of MOSFET 84 when power supply conductor 72 is supplied with a voltage of VDD. MOSFET 84 operates in the conductive mode to supply current to the reverse-biased diodes that are formed by semiconductor region 64 with substrate 62 and semiconductor region 64 with semiconductor region 66. In other words, the diode leakage currents are supplied by MOSFET 84.

When control terminal 74 is supplied with a logic zero value, i.e., a voltage value of about ground, MOSFET 84 is in a non-conductive mode. In the non-conductive mode MOSFET 84 is off and operates to block the supply of leakage currents to the reverse-biased diodes that are formed by semiconductor region 64 with substrate 62 and semiconductor region 64 with semiconductor region 66.

FIG. 8 is a third alternate embodiment of current limiting circuit 70. Current limiting circuit 70 is an N-channel MOSFET 86 having a gate terminal, a drain terminal, and a source terminal. In particular, the commonly connected gate terminal and drain terminal of MOSFET 86 serve as power supply conductor 72 of current limiting circuit 70. The source terminal of MOSFET 86 serves as output terminal 76 of current limiting circuit 70. The control terminal 74 of current limiting circuit 70 is not connected.

In operation, MOSFET 86 has a voltage value at output terminal 76 of VDD minus a threshold voltage value of MOSFET 86 when power supply conductor 72 is supplied with a voltage of VDD. MOSFET 86 operates in a conductive mode to supply the leakage currents of the reverse-biased diodes that are formed by semiconductor region 64 with substrate 62 and semiconductor region 64 with semiconductor region 66.

FIG. 9 is a fourth alternate embodiment of current limiting circuit 70. Current limiting circuit 70 is a PN-junction diode 88 having an anode and a cathode. In particular, the anode is connected to power supply conductor 72 of current limiting circuit 70. The cathode is connected to output terminal 76 of current limiting circuit 70. The control terminal 74 of current limiting circuit 70 is not connected.

In operation, diode 88 has a voltage value at output terminal 76 of VDD minus the voltage of the forward biased diode when power supply conductor 72 is supplied with a voltage of VDD. Diode 88 operates to supply the leakage currents of the reverse-biased diodes that are formed by semiconductor region 64 with substrate 62 and semiconductor region 64 with semiconductor region 66.

It is not a limitation of the present invention that current limiting circuit 70 represent a single device or a plurality of MOSFET devices. For instance, it is common practice for the memory array of memory circuit 24 to be organized into several sections or banks, such that each bank has reverse-biased diodes formed by semiconductor region 64 with substrate 62 and semiconductor region 64 with semiconductor region 66. A plurality of current limiting circuits 70 having commonly connected gate terminals can be used to limit the leakage currents of the reverse-biased diodes in each bank of the memory array.

Referring to FIG. 5, the P-channel MOSFET 80 has a gate structure connected to control terminal 74 that includes a width W and a length L. By way of example, the gate of MOSFET 80 can be sized to have a width W of about 1.0 micrometers and a length L of about 0.4 micrometers. When control terminal 74 is supplied with a voltage of about zero volts, MOSFET 80 is in the conductive mode and supplies a current of about 25 microamps. On the other hand, when control terminal 74 is supplied with a voltage of about VDD, MOSFET 80 is in the non-conductive mode and limits the leakage current to the reverse-biased diodes of each bank to a current of about 1.0 nanoamp.

By now it should be appreciated that a structure and method have been provided that limit diode leakage currents to prolong the battery life of a portable wireless system It has been further shown that the current limiting circuit has a small size and can be easily integrated to minimize the currents in a standby mode for a portable wireless system

We claim:

1. A memory circuit, comprising:
   a first semiconductor region disposed in a substrate;
   a second semiconductor region including a memory cell where the second semiconductor region is disposed in the first semiconductor region and isolated from the substrate by the first semiconductor region; and
   a current limiting circuit coupled between a conductor and the first semiconductor region.

2. The memory circuit of claim 1, wherein the current limiting circuit includes a metal oxide semiconductor field effect transistor (MOSFET) having a control terminal coupled for receiving a control signal, and first and second current conducting terminals for coupling the conductor to the first semiconductor region.

3. The memory circuit of claim 2, wherein the MOSFET in the current limiting circuit is a P-channel MOSFET.

4. The memory circuit of claim 2, wherein the MOSFET in the current limiting circuit is an N-channel MOSFET.

5. A wireless device, comprising:
   a translator coupled for receiving a transmitted signal and providing digital data;
   a processing circuit coupled for receiving the digital data; and
   a memory circuit providing data, the memory circuit comprising,
   (a) a first semiconductor region disposed in a substrate,
   (b) a second semiconductor region including a memory cell where the second semiconductor region is disposed in the first semiconductor region and isolated from the substrate by the first semiconductor region, and
   (c) a current limiting circuit coupled between a conductor and the first semiconductor region.

6. The wireless device of claim 5, wherein the current limiting circuit includes a P-channel metal oxide semiconductor field effect transistor (MOSFET) having a control terminal coupled for receiving a control signal, a first current conducting terminal coupled to the conductor, and a second current conducting terminal coupled to the first semiconductor region.

7. The wireless device of claim 6, wherein a voltage value of about VDD is on the control terminal of the P-channel MOSFET when the memory cell is in a standby mode.

8. The wireless device of claim 5, wherein the current limiting circuit includes an N-channel metal oxide semiconductor field effect transistor (MOSFET) having a control terminal coupled for receiving a control signal, a conducting terminal coupled to the conductor, and a second current conducting terminal coupled to the first semiconductor region.

9. The wireless device of claim 8, wherein a voltage value of about ground is on the control terminal of the N-channel MOSFET when the memory cell is in a standby mode.

10. An integrated circuit, comprising:
   a memory cell;
      an isolation region separating the memory cell from a substrate; and
      a current limiting semiconductor device provide a conduction path coupled between a conductor and the isolation region.

11. The integrated circuit of claim 10, wherein the current limiting semiconductor device includes a metal oxide semiconductor field effect transistor (MOSFET) having a control terminal coupled for receiving a control signal, and first and second current conducting terminals for coupling the conductor to the isolation region.

12. The integrated circuit of claim 11, wherein the MOSFET is a P-channel MOSFET.

13. The integrated circuit of claim 11, wherein the MOSFET is an N-channel MOSFET.

14. The integrated circuit of claim 11, wherein the MOSFET is an enhancement mode MOSFET.

15. A method of limiting leakage current, comprising the steps of:
   disposing a first semiconductor well in a substrate;
   disposing a second semiconductor well in the first semiconductor well to isolate the second semiconductor well from the substrate; and
   limiting a current between a conductor and the first semiconductor well.

16. The method of claim 15, wherein the step of limiting a current includes limiting a leakage current in a first diode formed by the first semiconductor well and the substrate.

17. The method of claim 15, wherein the step of limiting a current includes limiting a leakage current in a second diode formed by the first semiconductor well and the second semiconductor well.

18. The method of claim 15, further including the step of disposing a memory cell in the second semiconductor well.

19. The method of claim 18, wherein the step of limiting a current includes placing the memory cell in a standby mode.

* * * * *

UNITED STATES PATENT AND TRADEMARK OFFICE
CERTIFICATE OF CORRECTION

PATENT NO. : 5,898,633
DATED : April 27, 1999
INVENTOR(S) : James S. Caravella et al.

It is certified that error appears in the above-identified patent and that said Letters Patent is hereby corrected as shown below:

Column 7,
Line 11, after the second "a" add -- first current --.
Line 22, delete "provide" and add -- provides --.

Signed and Sealed this

Sixth Day of August, 2002

Attest:

Attesting Officer

JAMES E. ROGAN
Director of the United States Patent and Trademark Office